(12) United States Patent
Edelstein et al.

(10) Patent No.: US 10,203,353 B2
(45) Date of Patent: *Feb. 12, 2019

(54) METHOD AND SYSTEM FOR POSITIONING USING NEAR FIELD TRANSDUCERS, PARTICULARLY SUITED FOR POSITIONING ELECTRONIC CHIPS

(71) Applicant: Alan S. Edelstein, Alexandria, VA (US)

(72) Inventors: Alan S. Edelstein, Alexandria, VA (US); John M. Timmerwilke, Danbury, CT (US)

(73) Assignee: Alan S. Edelstein, Alexandria, VA (US)

( * ) Notice: Subject to any disclaimer, the term of this patent is extended or adjusted under 35 U.S.C. 154(b) by 75 days.

This patent is subject to a terminal disclaimer.

(21) Appl. No.: 15/483,719

(22) Filed: Apr. 10, 2017

(65) Prior Publication Data
US 2017/0356930 A1   Dec. 14, 2017

Related U.S. Application Data

(60) Provisional application No. 62/493,345, filed on Jul. 1, 2016, provisional application No. 62/494,717, filed
(Continued)

(51) Int. Cl.
*G01Q 10/04* (2010.01)
*G03F 7/20* (2006.01)
(Continued)

(52) U.S. Cl.
CPC .......... *G01Q 10/04* (2013.01); *G01Q 10/065* (2013.01); *G03F 7/70725* (2013.01);
(Continued)

(58) Field of Classification Search
None
See application file for complete search history.

(56) References Cited

U.S. PATENT DOCUMENTS

| 4,533,208 A | 8/1985 | Stowe |
| 5,774,221 A | 6/1998 | Guerra |
| (Continued) | | |

OTHER PUBLICATIONS

Atie, Elie et al. (2015). Remote optical sensing on the nanometer scale with a bowtie aperture nano-antenna on a fiber tip of scanning near-field optical microscopy. Applied Physics Letters. 106. 10.1063/1.49 (Year: 2015).*

(Continued)

*Primary Examiner* — Charles D Garber
*Assistant Examiner* — Alia Sabur
(74) *Attorney, Agent, or Firm* — Shlesinger, Arkwright & Garvey LLP

(57) ABSTRACT

Method for positioning and orienting a first object relative to a second object. The method includes positioning a near field transducer having an aperture on the first object, and directing a laser light toward the aperture of the near field transducer on the first object to create an evanescent wave on the other side of the aperture. Positioning a sensor on the second object for detecting the effervescent wave from the near field transducer. Providing an algorithm, and using information obtained from the sensor on the second object in the algorithm to control a nanopositioning system to position one of the first object and the second object in a desired position and orientation relative to the other one of the first object and the second object.

20 Claims, 12 Drawing Sheets

Related U.S. Application Data on Aug. 18, 2016, provisional application No. 62/495,406, filed on Sep. 14, 2016.

(51) Int. Cl.

| | | |
|---|---|---|
| *H02N 2/02* | (2006.01) | |
| *G01Q 10/06* | (2010.01) | |
| *G05B 19/23* | (2006.01) | |
| *G03F 9/00* | (2006.01) | |
| *G05B 19/402* | (2006.01) | |
| *G01Q 60/22* | (2010.01) | |
| *G01Q 80/00* | (2010.01) | |

(52) U.S. Cl.
CPC ......... *G03F 9/7003* (2013.01); *G05B 19/231* (2013.01); *G05B 19/402* (2013.01); *H02N 2/028* (2013.01); *G01Q 60/22* (2013.01); *G01Q 80/00* (2013.01); *G05B 2219/37387* (2013.01); *G05B 2219/45029* (2013.01)

(56) References Cited

U.S. PATENT DOCUMENTS

| | | |
|---|---|---|
| 8,022,792 B2 | 9/2011 | Howard |
| 8,824,200 B1 | 9/2014 | Edelstein |
| 9,030,780 B2 | 5/2015 | Edelstein |
| 9,048,881 B2 | 6/2015 | Edelstein et al. |
| 9,245,617 B2 | 2/2016 | Edelstein |
| 9,552,832 B2 | 1/2017 | Edelstein |
| 2009/0058564 A1 | 3/2009 | Howard |

OTHER PUBLICATIONS

Single-Metal Nonoscale Thermocouples, by Gergo P. Szakmany, et al., vol. 13, No. 6, Nov. 2014, IEEE Transactions on Nanotechnology (6 pages).

Fabrication of Bowtie Aperture Antennas for Producing Sub-20 nm Optical Spots, by Yang Chen et al., vol. 23, No. 7, Apr. 6, 2015 Issue, Optics Express (7 pages).

Plasmonic near-field transducer for heat-assisted magnetic recording, by Nan Zhou, et al., Review Article, Nanophotonics 2014: 3(3) (15 pages); Science Wise Publisher.

Plasmonic nano lithography with a high scan speed contact probe, by Yongwoo Kim et al., vol. 17, No. 22, Oct. 26, 2009, Optics Express (9 pages).

MCL Mad City Labs Inc. Internet Advertisement, re "MCL-NSOM shown without acoustic, light tight enclosure" undated, (http://www.madcitylabs.com) (3 pages).

Diffracted Evanescent Wave Model for Enhanced and [..] through Subwavelength Hole Arrays, Henric Lezec et al., vol. 12, No. 16, Aug. 9, 2004, Optics Express (23 pages).

On the Nature of the Evanescent Wave, Milan Milosevic, vol. 67, No. 2, 2013, Applied Spectroscopy (6 pages).

\* cited by examiner

METHOD AND SYSTEM FOR POSITIONING USING NEAR FIELD TRANSDUCERS, PARTICULARLY SUITED FOR POSITIONING ELECTRONIC CHIPS

CROSS REFERENCE TO RELATED APPLICATIONS

This application claims the benefit of U.S. Provisional Application No. 62/493,345, filed Jul. 1, 2016, and this application claims the benefit of U.S. Provisional Application No. 62/494,717, filed Aug. 18, 2016, and this application claims the benefit of U.S. Provisional Application No. 62/495,406, filed Sep. 14, 2016, and each of which is incorporated herein by reference.

BACKGROUND OF THE INVENTION

In research and manufacturing, it is often important to accurately position an object relative to another object. In doing this positioning, the sensing techniques used include capacitive sensing, interference techniques, strain sensors, avalanche photo diodes, and atomic force microscopes. Generally these techniques are expensive, do not positively identify when the correct position has been achieved, are not sufficiently accurate, and are inconvenient for use in vacuum deposition systems. Systems based on these techniques may also use sensors that are too large to be placed on small objects.

Mad City Labs (http://www.madcitylabs.com/) has a positioning system that uses a near field transducer (NFT) to radiate a small area with an evanescent field from a laser. NFTs have small apertures of size $d<\Delta$, the wavelength of the laser, that permit the light to pass a distance of about $d/2$ beyond the aperture. However, since $d<\Delta$ one can use NFTs to illuminate very small regions. Lasers and NFTs have been used previously in heat assisted magnetic recording (HAMR) to heat the magnetic media to 700° C. and in near field scanning microscopes. Heating the media reduces its coercivity so that it can be written using a smaller write magnetic field. In these applications, there is no sensor that is fabricated on the object that is illuminated by the evanescent field.

It can be seen by a person having ordinary skill in the art that the PRIOR ART systems have drawbacks.

OBJECTS AND SUMMARY OF THE INVENTION

An object of the invention is to overcome the drawbacks of the PRIOR ART.

The present invention uses a near field transducer (NFT) for positioning one object relative to another object, but in contrast to the above-described Mad City Labs system, in the method described by the invention an NFT is on one of the objects and a sensor is on the other object. The positioning method described by the present invention can be applied to positioning electronic chips to be placed on wafers containing other electronic components, stacking electronic chips, and placing an electronic wafer on another electronic wafer.

Accurate positioning is required for the manufacturing process listed above concerning placing electronic chips and wafers. Placing electronic chips and wafers as listed above increases the volume density of electronic components because it mitigates the problem of increasing the density of electronic components on the same chip or wafer. Because the electrons do not have to travel as far, placing chips on top of wafers or other chips or wafers on top of other wafers improves circuit performance. Electrical connections between electronic chips and wafers are made by flip chip bonding, vias, direct bond interconnects (DBI), and/or microbumps. It is desirable to position the chips or wafers accurately to facilitate making these interconnects. Advantages of very thin chips and wafers are that they are flexible, transparent, and more stable. These thin chips are very fragile and must be treated appropriately. Further, they may be distorted or warped so that they are not planar. They can be mounted so that they are planar by using electrostatic chucks.

The invention includes a method for positioning one object relative to another object that uses an NFT on one of the objects and a sensor on the other object. The invention described herein also sets forth how this method can be applied to position an electronic chip to be placed on a wafer containing other electronic components, stacking electronic chips, and placing an electronic wafer on another electronic wafer. The method improves the accuracy of aligning chips over the current optical method of aligning chips by a factor of about 50. The invention can also be applied to position magnetic disks in magnetic read systems.

The invention likewise includes the following embodiments.

A method for positioning and orienting a first object relative to a second object which includes positioning a near field transducer having an aperture on the first object, and directing a laser light toward the aperture of the near field transducer on the first object to create an evanescent wave on the other side of the aperture. Positioning a sensor on the second object for detecting the evanescent wave from the near field transducer, and providing an algorithm, using information obtained from the sensor on the second object in the algorithm to control a nanopositioning system to position one of the first object and the second object in a desired position and orientation relative to the other one of the first object and the second object.

The sensor may be an optical sensor, or a thermal sensor, such as a single metal thermocouple with a constriction, for example.

The laser light may be one of an ultraviolet light, a pulsed laser light, a modulated laser light, a pulsed ultraviolet light, and a modulated, pulsed ultraviolet light.

The method for positioning and orienting objects relative to one another likewise includes providing a first object, a second object, and a third object. The first object may be one of an electronic chip and a wafer, the second object may be one of an electronic chip and a wafer, and the third object may be an electronic chip. The first and third objects are to be stacked on top of the second object. The method further includes:

a) positioning a near field transducer having an aperture and a sensor on the first object;

b) directing a laser light toward the aperture of the near field transducer on the first object to create an evanescent wave on the other side of the aperture;

c) positioning a sensor with electrical connections that includes a switch to a measuring system on the second object for detecting the evanescent wave from the near field transducer on the first object;

d) providing an algorithm, using information obtained from the sensor on the second object in the algorithm to control a nanopositioning system to position the first object in a desired position and orientation relative to the second object;

e) after the first object is in the desired position and orientation relative to the second object, opening the switch in the electrical connections between the sensor on the second object and the measuring system;

f) after the first object is in the desired position and orientation relative to the second object, making a set of electrical connections between the following: the first and second objects, the measuring system, and the sensor on the first object;

g) positioning one of a near field transducer having an aperture and a sensor on the third object; and h) picking up the third object, and repeating the process to position the third object in the correct position and orientation relative to the first object by repeating the respective steps of directing a laser light toward the aperture of the near field transducer on the third object and using information obtained from the sensor on the first object, and then opening a switch in the respective electrical connections and then making a set of respective electrical connections.

The sensor may include a first sensor and a second sensor spaced apart from the first sensor on one of the first and second objects.

To position the first object relative to the second object, the one of the first object and the second object requires one of translation and rotation.

The sensor may include a single metal thermocouple, and the single metal thermocouple detects the position at which a difference between a signal and a background noise is a maximum, a minimum, and/or changes sign.

The positioning one of the first object and the second object in a desired position and orientation relative to the other one of the first object and the second object is performed with one of a stepper motor and a piezoelectric actuator.

The laser light energy may be transmitted to the near field transducer by one of a light pipe, a wave guide, and an optical fiber.

The first object may be one of a first electronic chip and a first wafer; the second object may be one of a second electronic chip and a second wafer; and at least two electrical connections are established between the first object and the second object after the first object and the second object are in the desired position and orientation.

The first object and the second object may be electronic chips.

The first object and the second object may be electronic wafers.

The first object may be a chip and the second object may be an electronic wafer.

The first object may include at least one chip and the second object may include at least one electronic wafer. The near field transducer may be on a different location on each of the at least one electronic chip, and the sensor may be on a different location on each of the at least one electronic wafer and the at least one electronic chip.

A post may be provided on at least one of the first object and the second object, the post controls a minimum separation between the first object and the second object.

The first and second objects may be positioned inside a dust free chamber. The first object is a first magnetic read head, and the second object is a disk containing information stored in the form of magnetic bits. A second magnetic read head may be provided, and the disk is removed from the second magnetic read head and positioned in a desired position relative to the first magnetic read head.

The invention further includes a method for positioning and orienting a first object relative to a second object, in which:

a) the information on the disk is stored in the form of bits with different magnetic permeability;

b) each of the first and second magnetic read heads includes a source for a magnetic probe field;

c) the magnetic probe field can be altered by the magnetic permeability of the bits; and d) each of the first and second magnetic read heads measures the degree to which the magnetic field is altered by the magnetic permeability of the bits.

The invention still further includes a method for positioning and orienting a first object relative to a second object, the method including:

a) positioning a near field transducer having an aperture on the first object;

b) directing a laser light toward the aperture of the near field transducer on the first object to create an evanescent wave on the other side of the aperture;

c) positioning a sensor on the second object for detecting the evanescent wave from the near field transducer; and d) providing an algorithm, using a signal amplitude and using the known position and orientation of the near field transducer and the sensor on the first and second objects in the algorithm to determine a desired position and orientation, and using the algorithm to control a nanopositioning system to position the first object in the desired orientation and location relative to the second object.

Relative terms such as left, right, up, and down are for convenience only and are not intended to be limiting.

BRIEF DESCRIPTION OF THE DRAWINGS

The embodiments herein will be better understood from the following detailed description with reference to the drawings, in which.

DETAILED DESCRIPTION OF THE INVENTION

Figure 1:
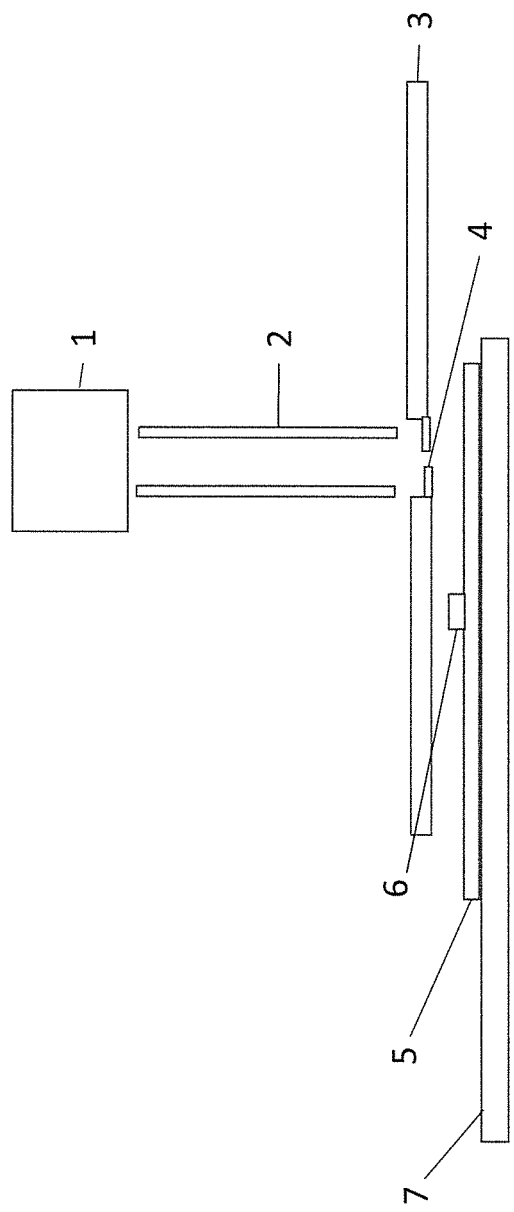
FIG. 1 is a schematic view of the positioning system.

FIG. 1 is a schematic representation of the positioning system according to an embodiment of the invention.

The elements in FIG. 1 are a laser 1, a waveguide 2, a first object 3, a near field transducer (NFT) 4 on the first object, a second object 5, a sensor 6 on the second object, and a system 7 for translating the second object 5 in three directions and rotating the second object 5 with the sensor 6. Alternatively, the system 7 could instead be positioned so that it translates in three dimensions and rotates the first object 3 and associated optical components. The laser and NFT on the first object 3 create an evanescent field that illuminates a nanosized area on the second object 5. The second object with the sensor 6 is translated and rotated until the sensor is in the illuminated area, detects the evanescent field, and the second object is in the correct position. An ideal sensor for detecting the laser light is a single metal thermocouple. The method described in connection with this invention will be capable of positioning the first object 3 relative to the second object 5 with an accuracy of 20 nm. The method has the advantage of giving a positive identification when the correct position has been achieved.

The embodiments set forth herein and the various features and advantageous details thereof are explained more fully with reference to the non-limiting embodiments that are illustrated in the accompanying drawings and detailed in the following description. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The regions illustrated in the figures are schematic in nature and their shapes are not intended to illustrate the precise shape of a region of a device and are not intended to limit the scope of the present invention.

The invention describes a method for positioning one object, which may be termed a first object, relative to another object, which may be termed a second object, that uses an NFT on one of the objects and a sensor on the other one of the objects. Position accuracy, as will be readily understood, may be limited by the ability to fabricate sufficiently small NFTs and sensors depending on the intended use. The system for utilizing this embodiment of the invention is shown schematically in FIG. 1. The laser 1 could be a diode laser with a wavelength of about 800 nm that supplies as much as 300 mW or more power. It is also contemplated that the wavelength may be in the range of about 200-2000 nm. Ideally the amplitude of the laser should be modulated and/or pulsed. Modulating the amplitude or pulsing the laser will permit AC detection of the signal by the sensor 6. The modulation or pulse frequency should be between 40 Hz and 100 MHz. The waveguide 2 could be an aluminum coated tapered optical fiber. Other possible waveguides are single mode waveguides, plane solid immersion mirrors with a dual offset grating, thin film dielectric waveguides with a high refractive index core, and metallic surface plasmon waveguides. Optical fibers could also be used to transmit the light. The laser 1 and NFT 4 on the first object 3 create an evanescent field that illuminates a nanosized area on the second object 5 positioned near the first object containing the sensor 6. There is a system 7 for translating in three directions and rotating the second object 5 with the sensor 6. It is likely that only a single axis of rotation is needed. Piezoelectric actuators and stepper motors may be used in the system 7. Alternatively to translating and rotating the second object 5 and the sensor, there could be a system for translating and rotating the NFT on the first object 3 and the optical components supplying light to the NFT 4.

Figure 2B:
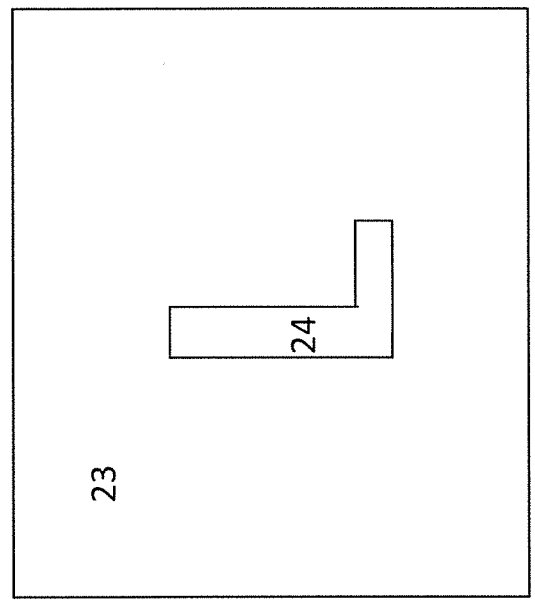
FIG. 2B shows a plan view of an L near field transducer aperture.
Figure 2A:
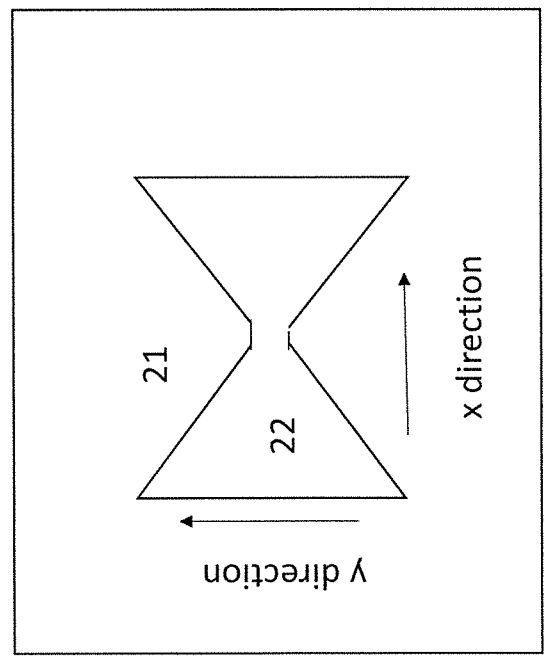
FIG. 2A shows a plan view of a bowtie near field transducer aperture.
Figure 3:
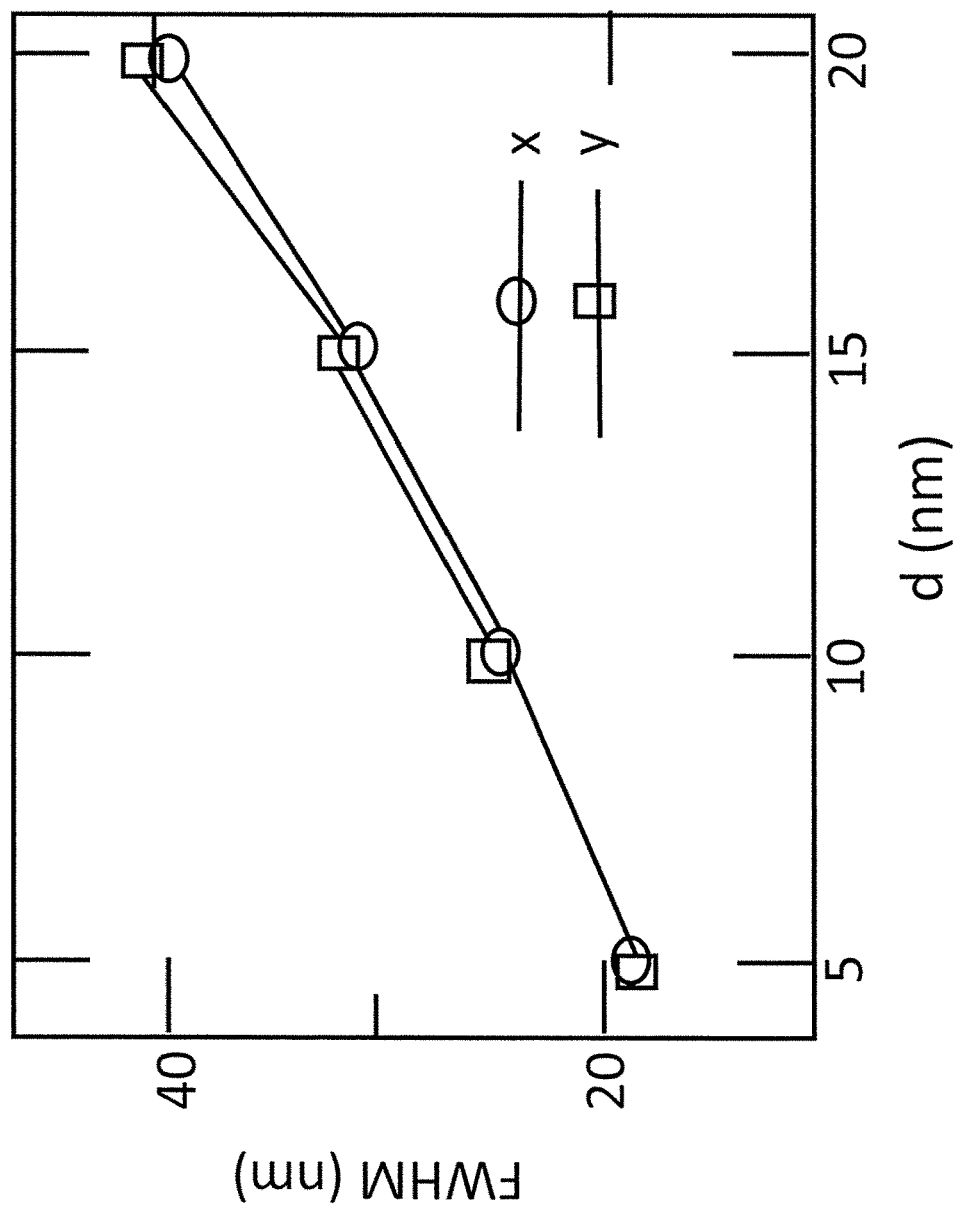
FIG. 3 presents PRIOR ART data showing that spots as small as 20 nm can be produced using near field transducers with bowtie apertures.

Bowtie and the L apertures shown in FIG. 2A and FIG. 2B are possible choices for the aperture of the NFT 4. In FIGS. 2A and 2B, 21 and 23 are thin metallic films and 22 and 24 are air or some material that does not absorb the laser light. Other configurations of NFTs may be used. The size of the apertures will be in the range 2 to 50 nm. FIG. 3 shows data obtained by Zhou et al. (Nanophotonics 3(3), pp. 141-155 (2014)) on a bowtie NFT. Plotted is the full width at half the maximum amplitude (FWHM) of the illuminated region as a function of the size d of the aperture gap. One sees that one can produce illuminated regions as small as 20 nm using an NFT with a bowtie aperture. Chen et al. (Optics Express, Vol. 23, Issue 7, pp. 9093-9099 (2015)) describe a method of fabricating bowtie NFTs in silicon wafers that produce less than 20 nm spots.

Figure 4:
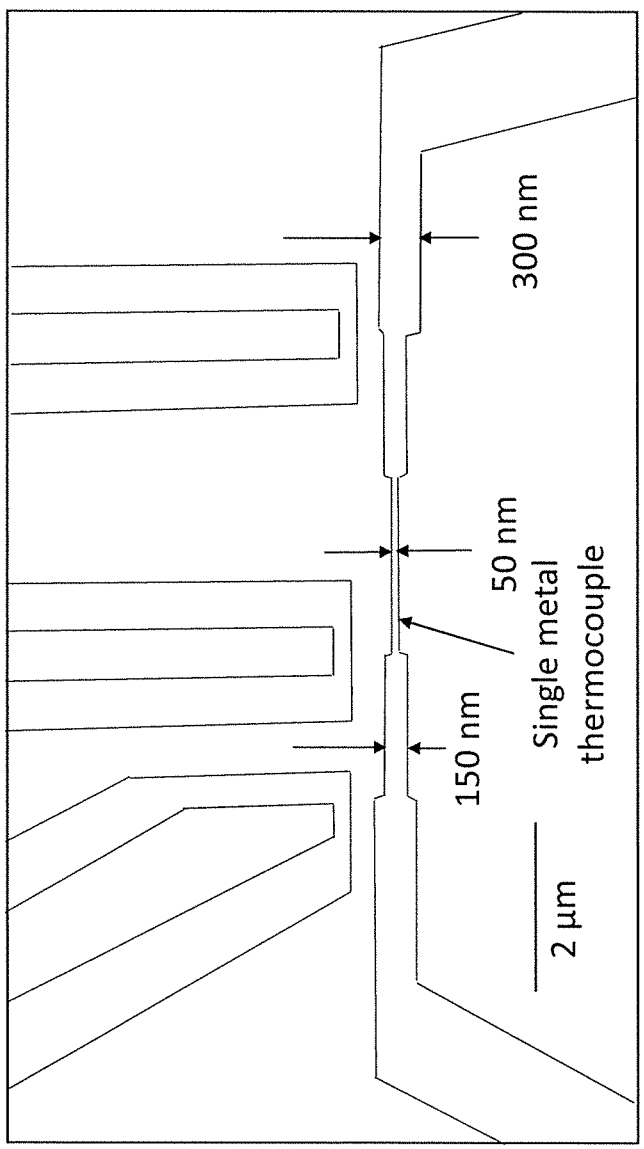
FIG. 4 is a PRIOR ART representation of a scanning electron microscope image of a single metal thermocouple.

Different kinds of sensors could be used for the sensor 6 in FIG. 1. For example, the sensor could be sensitive to the wavelength of the laser light or a thermocouple. A single metal thermocouple is a good choice for the sensor. Szakmany et al. (IEEE Trans. Nanotechnology 13, No. 6, pp. 1234 (2014)) have investigated single metal nanoscale thermocouples. FIG. 4 shows a representation of a scanning electron microscope image of a single metal thermocouple taken from their work. The metal strip of different widths is composed of a single metal, nickel. Because the scattering of electrons in the narrow sections is different from that in wide sections, the metal in these sections behaves as a different metal. The metal strips at the top of the image in FIG. 4 were used to heat different sections of the thermocouple. The thermocouple was fabricated on a silicon wafer with 500 to 1000 nm thick thermally grown coating of silicon dioxide that provides thermal insulation. They found that raising the temperature 0.3° C. created a thermocouple voltage of 0.3 μV and that the response was linear as a function of applied power. Because the hot spot created by our laser will be about 100 times hotter, we expect a much larger thermocouple voltage.

Figure 5:
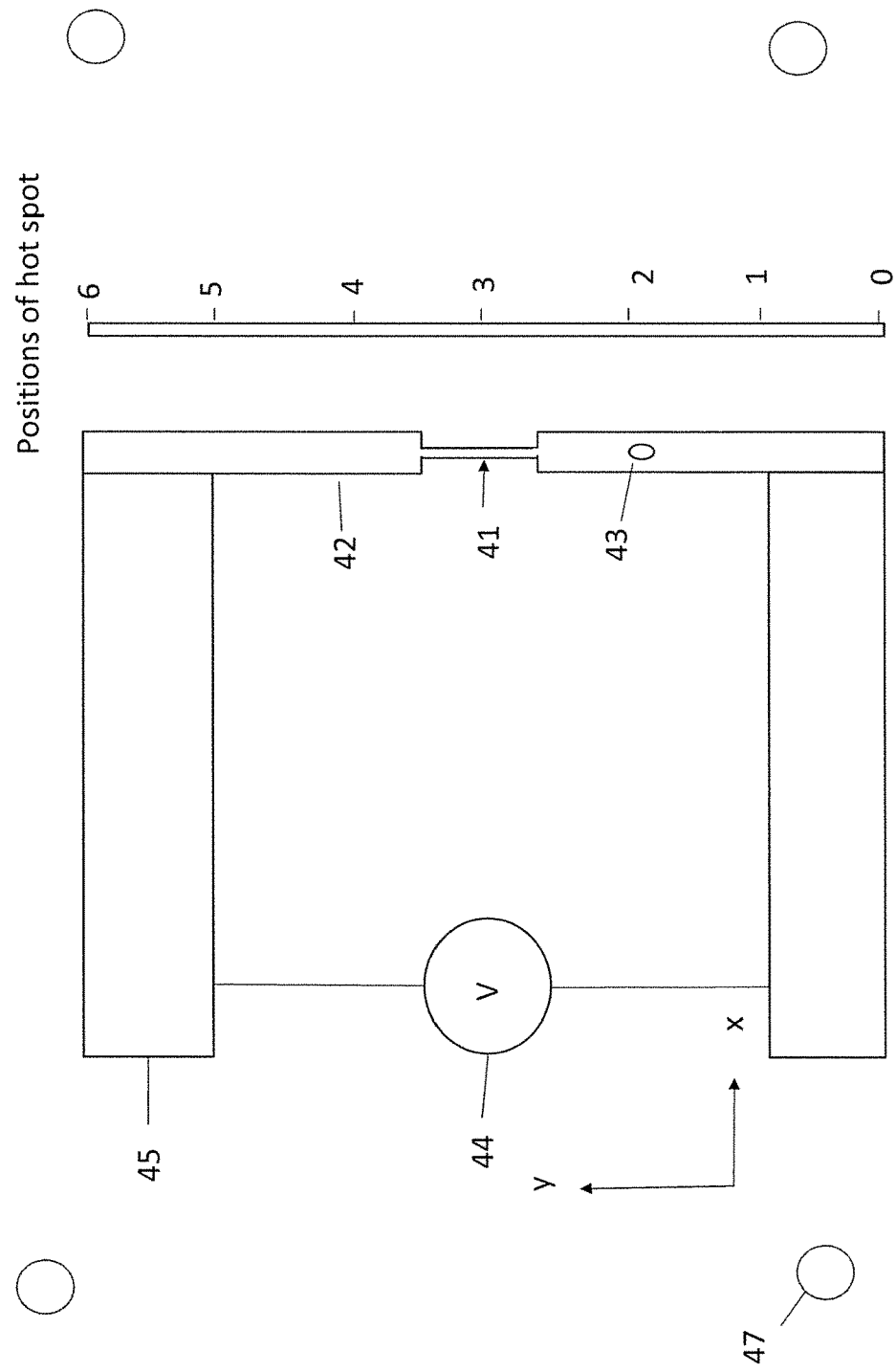
FIG. 5 is a schematic view of a single metal thermocouple system. Also shown is a hot spot 43 created by an evanescent field and a scale that can be used to indicate the position of the hot spot.

FIG. 5 shows a schematic picture of a single metal thermocouple system. In FIG. 5, there is a thin, short, narrow metallic film section 41. This section should be 20 nm or less wide. It also should be short with its length three or four times its width. Two, wider sections of film 42 of the same metal are connected to the thin section 41. The wider sections should be about four to ten times wider than the thin section. Connected to the wider sections are gold electrodes 45. Also shown in FIG. 5 is the location 43 of a roughly circular area of the film that has been heated to several hundred degrees centigrade by an evanescent field from a laser and NFT. There are posts 47 normal to the surface that are 1 to 30 nm high that are used to control the separation between the two items 3 and 5 in FIG. 1. The posts avoid problems due to stiction that, if not eliminated, could prevent one object moving relative to the other object. Stiction, or static friction, is the frictional force that that must be overcome to move objects with clean, flat surfaces when they are brought together. The narrow section 41 and wider section 42 films are deposited at the same time on top of the thermally grown $SiO_2$ layer on a Si wafer. The $SiO_2$ layer provides thermal insulation. The film sections 41 and 42 have the same thickness and are between 1 to 40 nm thick. The film sections 41 and 42 can be composed of Ni, Pd, Cr, Au, or B. The thermoelectric voltage is measured by a voltage measuring system 44 consisting of a low noise amplifier and lock in amplifier such as the Materials Research Systems model SR810/SR830.

Figure 6:
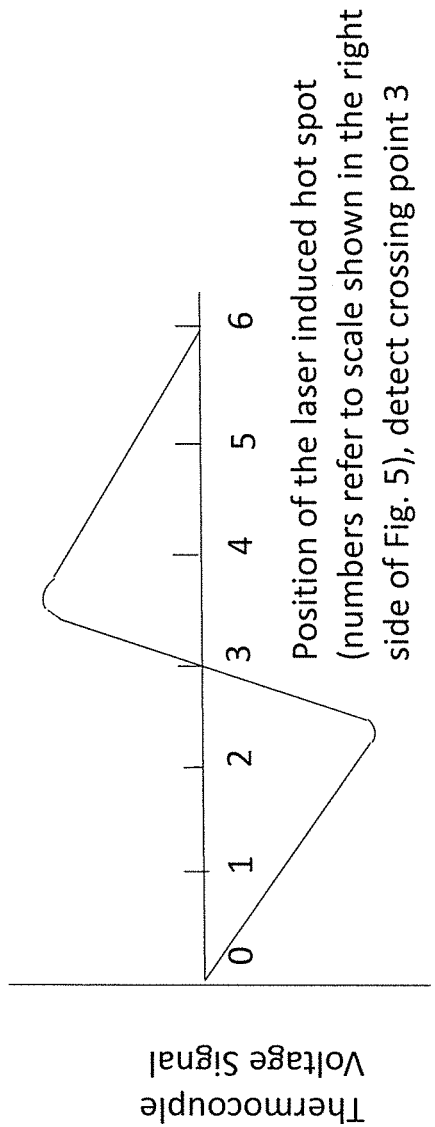
FIG. 6 shows the expected thermoelectric voltage as a function of the hot spot's position based on the scale shown in FIG. 5.

Based on Szakmany et al.'s results, one can estimate the qualitative performance of the single metal thermocouple sensor described in this invention. FIG. 6 shows the expected dependence of the thermocouple voltage as a function of the position of the hot spot produced by the laser and NFT. Plotted is the relative thermoelectric voltage minus the background noise as the sensor is translated in the y direction (labelled "position of the laser induced hot spot") so that the induced hot spot 43 in FIG. 5 is moved along the thin film sections 41 and 42 of the thermocouple. (One of the film sections may be considered a narrow section 41, and one of the film sections may be considered a wider section 42). The numbers on the x axis of FIG. 6 indicate the y positions of the (laser induced) hot spot according to the scale 0-6 shown on the right side of FIG. 5.

Figure 7:
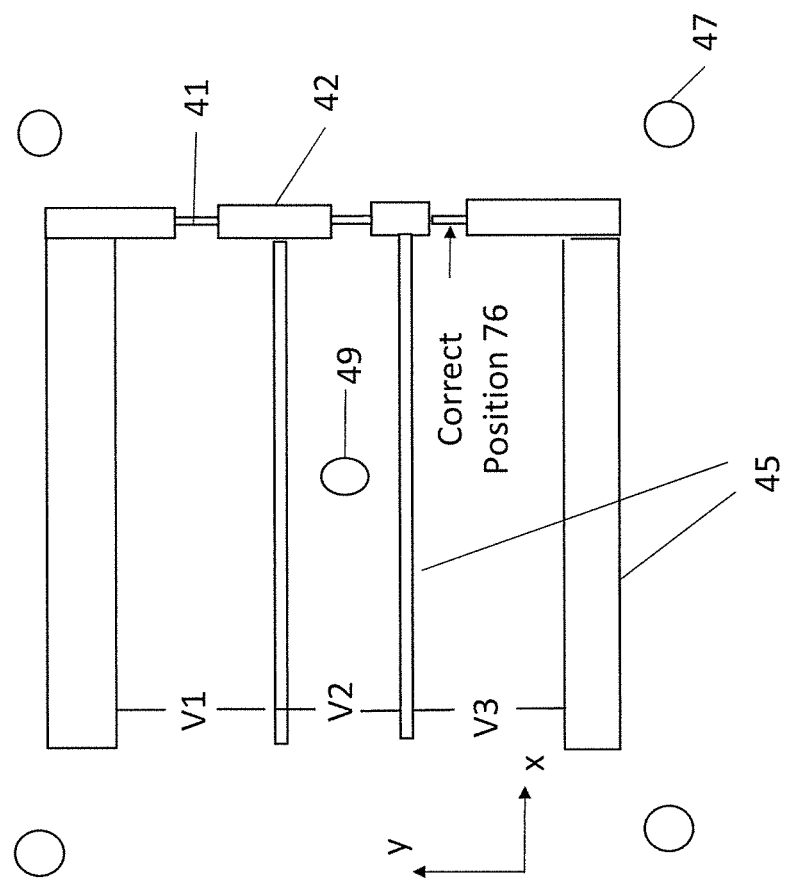
FIG. 7 is a schematic view of a different version of a single metal thermocouple system that can be used for positioning.

A modified version of the single metal thermocouple is shown in FIG. 7. In the modified version there are a number of narrow sections 41, and a number of wider sections 42, spacing posts 47, electrodes 45, and three voltage measuring positions V1, V2, and V3. Also shown is the axis 49 for rotations made by the system 7 that may be termed rotation axis 49. If a large temperature rise is limited to a radius of 150% of the radius of the hot spot, then only a single voltage measurement along the entire length of the single metal film could be used instead of the three measurements.

By using the translating and rotating system 7 shown in FIG. 1, one can use the thermocouple readings to position the second object 5 relative to the first object. The system 7 can translate in the x, y, and z directions and make a rotation about the rotation axis 49 using both piezoelectric actuators and step motors. First, make translations in the x direction at different y values to find a y position such that the difference D of the thermoelectric voltage V and the background noise N is greater in magnitude than the background noise N. The second object 5 is then rotated around the axis 49 and translated in the x and y directions until an angular position is found where all three voltages change in a manner similar to that as depicted in FIG. 6 during a translation in the y direction without any rotation. To improve the accuracy of the correct angular orientation one could have more than the three narrow sections in the thermocouple detector shown in FIG. 7 or the sections between the narrow sections could be made longer. The angular position of the second object 5 is now correct. If there are only electrodes at the end of the chain of thermocouples, then by using different lengths for the short or long sections in FIG. 7, one can determine the position of the hot spot on the chain of thermocouples. This can be accomplished by using thermocouple measurements as a function of position along the chain. The last step is to translate in the y direction to the correct position. It may be more accurate to locate the correct position at one of the midpoints of a narrow section, position 76 in FIG. 7, where D changes sign. A significant advantage of this new positioning system is that it identifies the correct position. Many other positioning systems are only sensitive to the change in position and do not identify the correct position.

Figure 8:
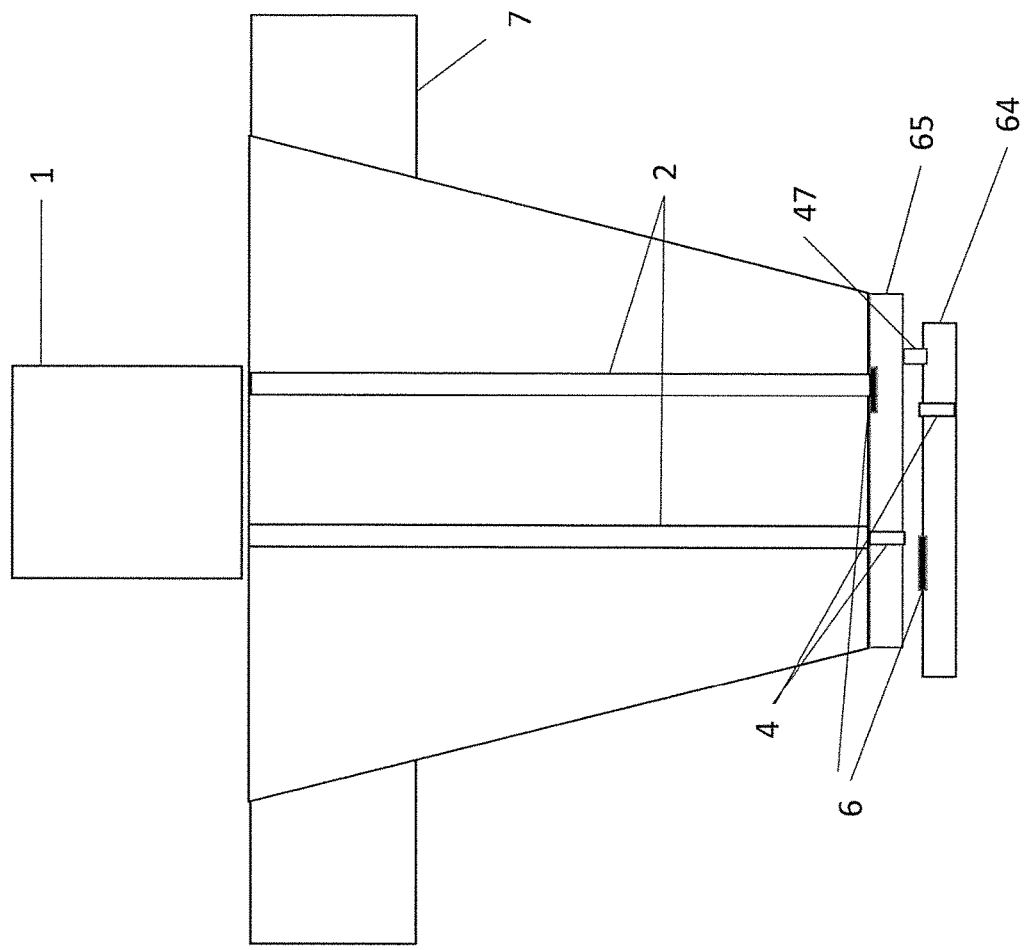
FIG. 8 is a schematic view of a system for positioning one electronic chip on top of another electronic chip or for stacking electronic chips.

The invention set forth herein also presents a method for properly positioning electronic chips on top of wafers, chip stacking, and wafers on top of wafers. As mentioned earlier, electronics fabrication that uses these non-single planar approaches increases the volume density of electronic components and circuit performance. FIG. 8 illustrates using the positioning system for stacking electronic chips. If the system is used for placing one chip 65 on top of another chip 64, only the top chip 65 would have an NFT 4 and only the bottom chip 64 would have a sensor 6. The process of placing a single chip on top of anther chip or wafer is similar to process of stacking chips described below. The items in FIG. 8 are a laser 1, optical waveguides 2, NFT 4, and, sensors 6 on each chip, the last chip in the stack (i.e., chip 64), the next chip to be added (i.e., chip 65), and a system 7 for translating in three directions and rotating the next chip 65 with the sensor 6 and NFT 4. The two chips are held during positioning and during the processing of making electrical interconnects by vacuum or electrostatic chucks. The height of the posts 47 (not shown) controls the separation between the two chips.

Figure 9:
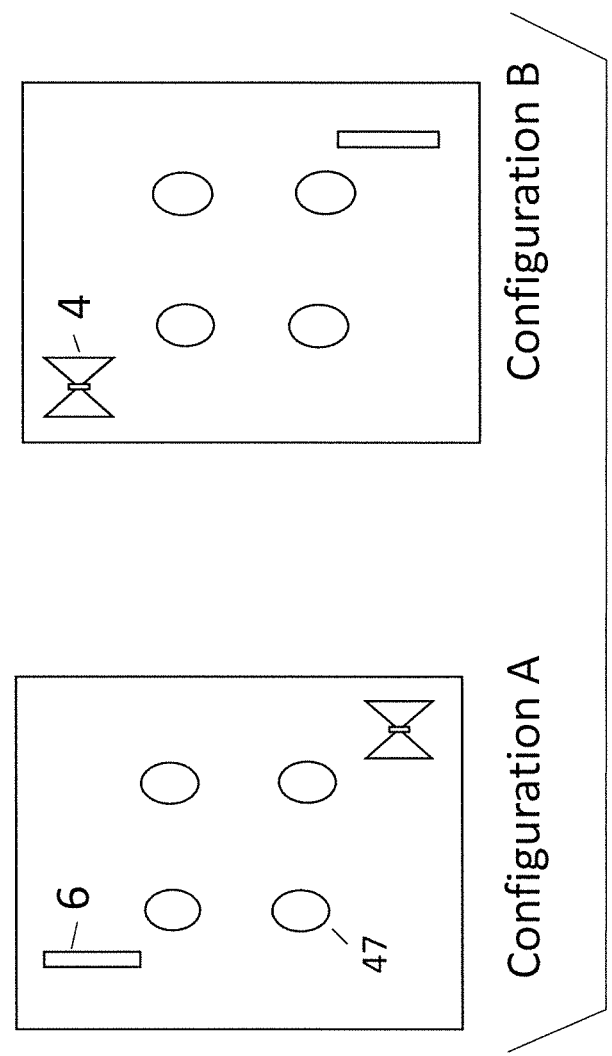
FIG. 9 shows the configurations A and B of the near field transducers and sensors on different electronic chips that can be used for stacking chips.

Each wafer to be stacked will have an NFT 4 and a sensor 6, but they will be configured in two different configurations, either configuration A or configuration B, as illustrated in FIG. 9. The NFTs 4 have their apertures on the underside surface of the chip, whereas the sensors 6 are on the top surface of the chip. There are electrical connections (not shown) to measure the output of the sensors. The stack is fabricated, by example, by first placing a chip with configuration A at the bottom of the stack. Then the next chip, that is to be added, has configuration B.

The pulsed laser light directed through NFT 4 on the next chip 65 heats a spot on the last chip 64, with configuration A, to several hundred degrees Celsius (centigrade). In doing this application and other positioning applications it is desirable to use the modified version of the single metal thermocouple shown in FIG. 7 as the sensor. The measurements of the thermocouple voltages V1, V2, and V3 are made by switching sequentially to a high quality preamplifier and lock in amplifier. Alternatively, three high quality preamplifiers and lock in amplifiers may be used. The next chip is translated in the x direction at different y values, as in FIG. 7, until a y position is found where the magnitude of the difference D between the thermoelectric voltage V and the background noise N is greater than the background noise N. The next chip is then rotated around the axis 49 and translated in the x and y directions until an angular position is found where all three voltages change as depicted in FIG. 6 by a translation in the y direction without any rotation. At this angular position, the two chips are aligned parallel to one another. The next chip is then moved so that the hot spot is at the correct position 76 in FIG. 7 by a translation in the y direction. After the two chips are correctly aligned, electrical connections can then be made between the two chips using vias or some other similar means; i.e., similar electrical connector. A third chip with configuration A is then added and the process is repeated. Thus, the process of stacking the chips can be continued.

The accuracy will be improved by adding more NFTs and sensors and optimizing the positioning. The accuracy of the positioning will also depend on the ability to fabricate very small NFTs and sensors.

There are many possible fabrication techniques for making small structures. These techniques include e-beam lithography, focused ion beam etching, atomic force microscope (AFM) lithography, and plasmonic nanolithography. E-beam lithography can be performed down to 20 nm. Plasma lithography can be used to make 50 nm NFTs (Kim et al., Plasmonic nanolithography with a high scan speed contact probe, 26 Oct. 2009/Vol. 17, No. 22/OPTICS EXPRESS 19478). For manufacturing, one can use multiple optical lithography.

The accuracy will also depend on the ability to translate the sensor with a small, less than 10 nm, separation between the sensor and NFT. Smaller separations are maintained on hard disk drives using air cushions and lubricants. Thus, maintaining a small separation should not be too difficult. For example, the chip with the sensor may have posts 47, as shown in FIG. 5, that control the separation between the chips.

Figure 10:
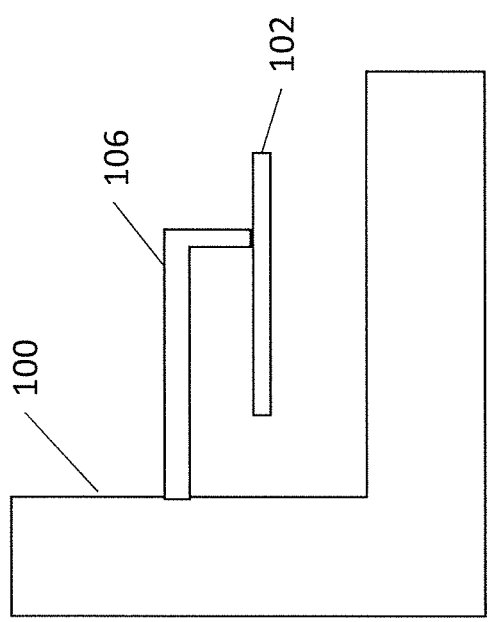
FIG. 10 shows a schematic view of the new read system, read head, and magnetic disk.
Figure 11:
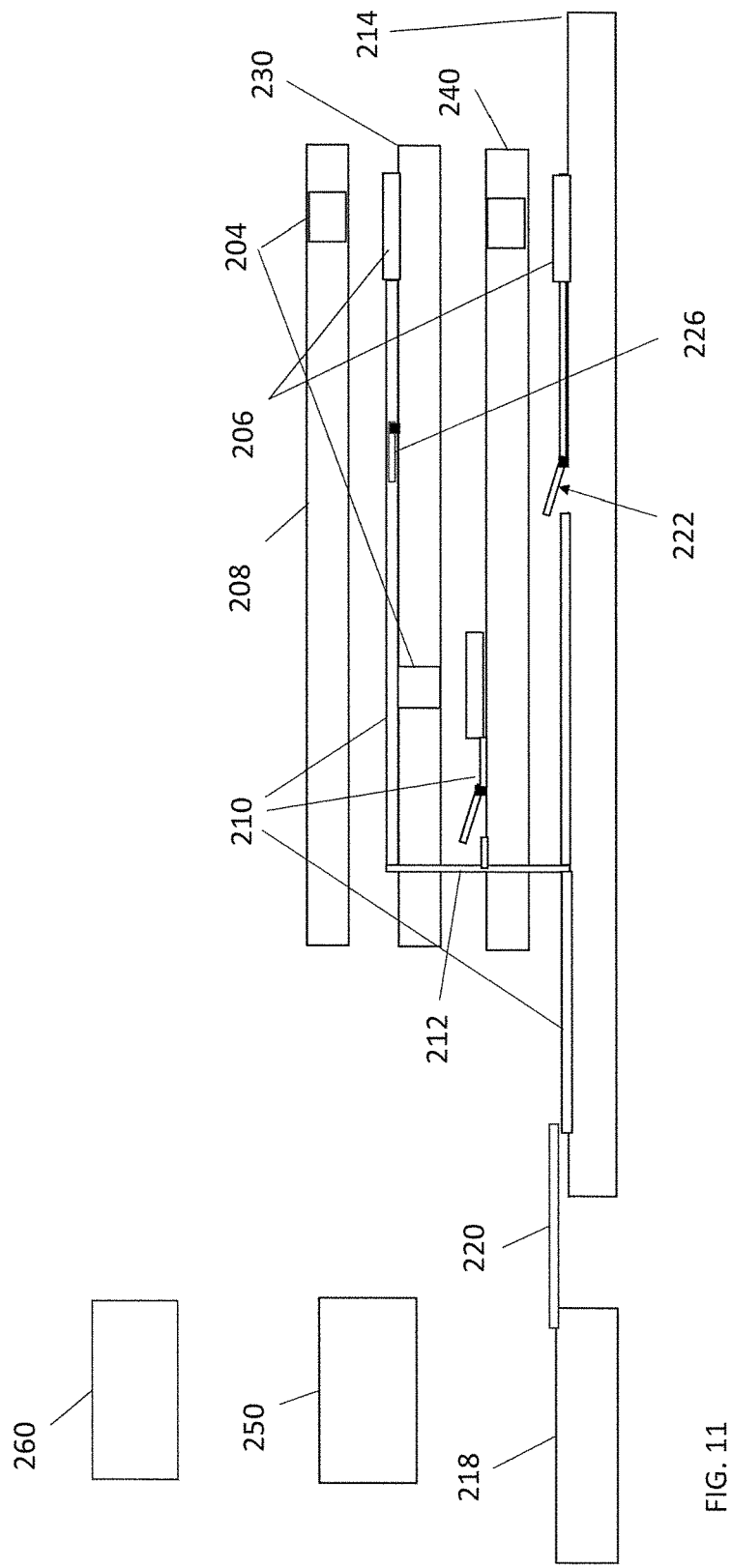
FIG. 11 shows a schematic view of chip stacking that shows a bottom wafer, chips stacked on bottom wafer, electrodes, switches, and voltage measuring system.

FIGS. 10 and 11 are described below.

Figure 12:
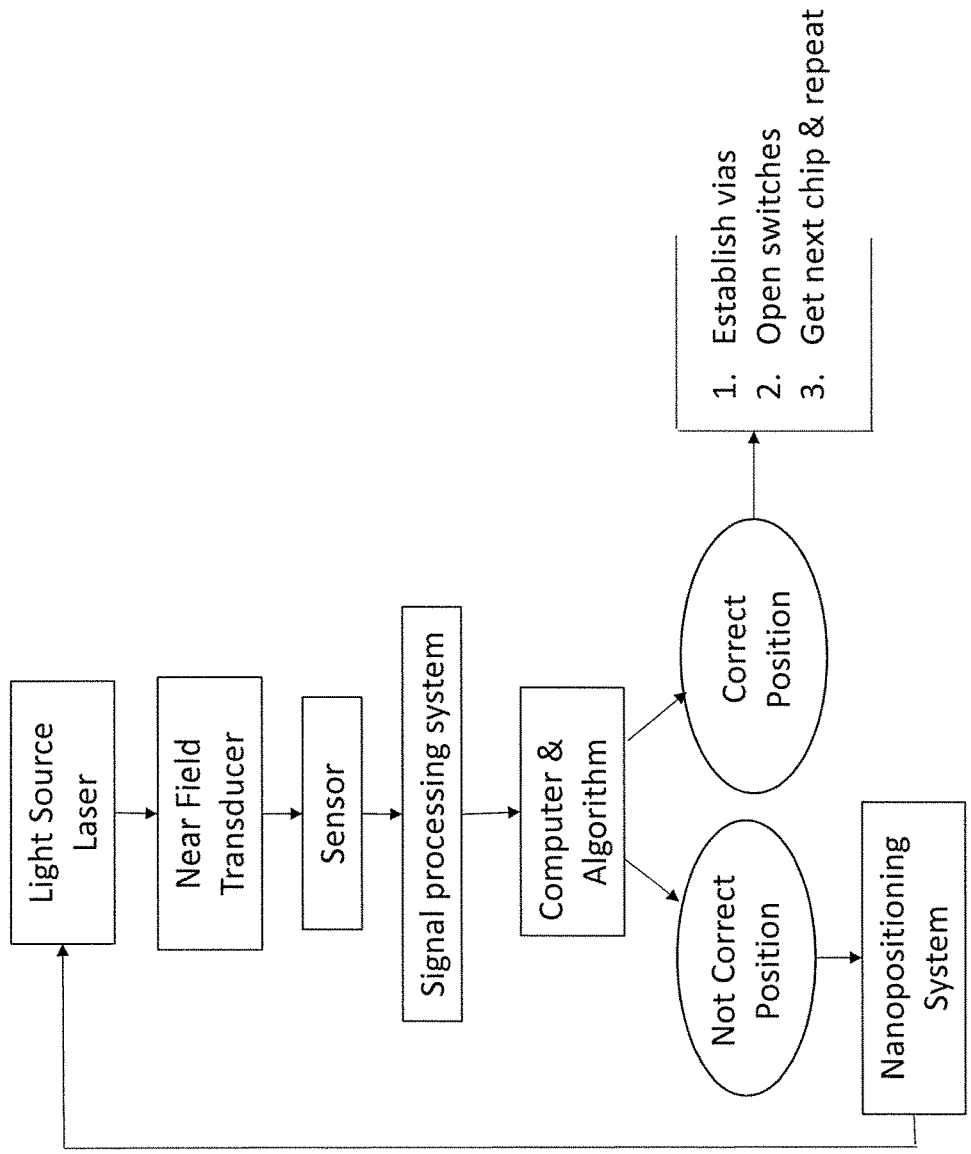
FIG. 12 shows a diagram of the steps used in chip stacking.

The following steps for positioning chips or wafer is summarized in FIG. 12:
1. Laser light (i.e., a light source illuminates the near field transducer on a first object.
2. The near field transducer creates an evanescent field that transfers energy to a small region on a second object.
3. Sensor on the second object inputs information from the sensor about the energy transfer to the signal processing system.
4. Signal processing system output is sent to a computer that has a positioning algorithm.
5. If the chips are not correctly positioned and oriented relative to one another, the computer instructs the nanopositioning system to move the first object.
6. If the chips are correctly positioned and oriented relative to one another,
   a. then electrical connections such as vias are established between the two objects; and
   b. If other objects, such as chips, are to be added, then the switches on the second object are opened and the next object, such as a chip, is picked up and placed so that the process can be repeated.

FIG. 11 shows a schematic view of chip stacking that shows a bottom wafer 214 and chips stacked on the bottom wafer.

The process of placing objects on top of one another is illustrated in FIG. 11. FIG. 11 is the case of stacking chips. The bottom or base wafer 214 has sensors 206 that are electrically connected to a signal processing system 218 and a computer 260 with an algorithm by conductors 220 and 210. Depicted in FIG. 11 is the situation after two chips 230 and 240 have already been placed correctly on the base wafer and an additional chip 208 is being added. This situation was obtained as follows. Chip 240 is positioned correctly over the base wafer by illuminating its NFT 204 with laser light. Sensors 206 on the base wafer 214 send their signals to the signal processing system 218 on paths 210 and 220. The signal processing system 218 sends its outputs to the computer 260 that has a positioning algorithm. The computer 260 sends commands to a nanopositioning system 250 to change the position and/or orientation of the laser and of chip 240. If there are n sensors on the base wafer or chip, there must be n+1 paths and n switches. Once the first chip 240 to be added is in the correct position, the electrical connection between the sensor 206 on the base wafer 214 and the signal processing system is broken by opening the switch 222 on the base wafer and electric connections 212, such as vias, are made between the chip 240 and the base wafer 214. Possible switches include transistors and fuses 222; they may be considered one-time transistors or switches. Switches 222 are shown as open switches and switches 226 are shown as closed in FIG. 11. The next chip 230 that has NFT, sensors and closed switches 226 is then picked up and placed so that the process can be repeated.

Each of switches 222 and 226 may be transistors and one-time switches, such as fuses.

There are alternative designs. One could replace the NFT with a very small aperture laser. Other kinds of sensors could be used such as UV detectors.

One could use atomic force microscope (AFM) lithography. One could use a thermocouple that, in addition to the narrow single metal section, also includes larger, dissimilar metal sections. Using this more complicated thermocouple with a different set of positioning instructions would permit more rapid positioning.

Another application of the positioning system would be to correctly position magnetic hard disks in disk read systems. Magnetic information stored in the form of bits with different values for their magnetic permeability has the advantage that the information will last much longer than information stored on current magnetic disks. If one uses magnetic permeability bits, one must add a magnetic probe field that can be obtained by having a magnetic field source in the read head. The magnetic permeability bits can modify the probe field. This modification is measured by the read head. A problem in realizing this advantage is that the read system does not last as long as the magnetic permeability media. The nanopositioning system 250 described here can be used to accurately position a magnetic storage disk with magnetic permeability bits in a new read disk system when a read disk system fails to function properly. The transfer from the old system to the new system can be made in a space that has clean, filtered air so that particulates do not land on the disk or affect the operation of the read head.

FIG. 10 shows a schematic view inside the clean space of the new read system 100 that has a read head 106 and the magnetic storage disk 102. The positioning systems is used to accurately position the disk 102 relative to the read head.

The foregoing description of the specific embodiments are intended to reveal the general nature of the embodiments herein so that others can, by applying current knowledge, readily modify and/or adapt for various applications such specific embodiments without departing from the generic concept, and, therefore, such adaptations and modifications should be and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

What is claimed is:

1. A method for positioning and orienting a first object relative to a second object, the method comprising:
   a) positioning a near field transducer having an aperture on the first object;
   b) directing a laser light toward the aperture of the near field transducer on the first object to create an evanescent wave on the other side of the aperture;
   c) positioning a sensor on the second object for detecting the evanescent wave from the near field transducer; and d) providing an algorithm, using information obtained from the sensor on the second object in the algorithm to control a nanopositioning system to position one of the first object and the second object in a desired position and orientation relative to the other one of the first object and the second object.

2. The method for positioning and orienting a first object relative to a second object as in claim 1, wherein:
a) the sensor is an optical sensor.

3. The method for positioning and orienting a first object relative to a second object as in claim 1, wherein:
a) the sensor is a thermal sensor.

4. The method for positioning and orienting a first object relative to a second object as in claim 1, wherein:
a) the sensor is a single metal thermocouple with a constriction.

5. The method for positioning and orienting a first object relative to a second object as in claim 1, wherein:
a) the laser light is one of an ultraviolet light, a pulsed laser light, a modulated laser light, a pulsed ultraviolet light, and a modulated, pulsed ultraviolet light.

6. A method for positioning and orienting objects relative to one another, comprising:
a) providing a first object, a second object, and a third object;
b) the first object being one of an electronic chip and a wafer; the second object being one of an electronic chip and a wafer; the third object being an electronic chip; and the first and third objects are to be stacked on top of the second object;
c) positioning a near field transducer having an aperture and a sensor on the first object;
d) directing a laser light toward the aperture of the near field transducer on the first object to create an evanescent wave on the other side of the aperture;
e) positioning a sensor with electrical connections that includes a switch to a measuring system on the second object for detecting the evanescent wave from the near field transducer on the first object;
f) providing an algorithm, using information obtained from the sensor on the second object in the algorithm to control a nanopositioning system to position the first object in a desired position and orientation relative to the second object;
g) after the first object is in the desired position and orientation relative to the second object, opening the switch in the electrical connections between the sensor on the second object and the measuring system;
h) after the first object is in the desired position and orientation relative to the second object, making a set of electrical connections between the following: the first and second objects, the measuring system, and the sensor on the first object;
i) positioning one of a near field transducer having an aperture and a sensor on the third object; and
j) picking up the third object that includes the one of a near field transducer and sensor, and repeating the process to position the third object in the correct position and orientation relative to the first object by repeating the respective steps of directing a laser light toward the aperture of the near field transducer on the third object and using information obtained from the sensor on the first object, and then opening a switch in the respective electrical connections and then making a set of respective electrical connections.

7. The method for positioning and orienting a first object relative to a second object as in claim 1, wherein:
a) the sensor includes a first sensor and a second sensor spaced apart from the first sensor on one of the first and second objects.

8. The method for positioning and orienting a first object relative to a second object as in claim 1, wherein:
a) to position the first object relative to the second object includes one of translation and rotation.

9. The method for positioning and orienting a first object relative to a second object as in claim 1, wherein:
a) the sensor is a single metal thermocouple, and the single metal thermocouple detects the position at which a difference between a signal and a background noise is one of a maximum, a minimum, and a sign change.

10. The method for positioning and orienting a first object relative to a second object as in claim 7, wherein:
a) positioning one of the first object and the second object in a desired position and orientation relative to the other one of the first object and the second object is performed with one of a stepper motor and a piezoelectric actuator.

11. The method for positioning and orienting a first object relative to a second object as in claim 1, wherein:
a) the laser light energy is transmitted to the near field transducer by one of a light pipe, a wave guide, and an optical fiber.

12. The method for positioning and orienting a first object relative to a second object as in claim 1, wherein:
a) the first object is one of a first electronic chip and a first wafer;
b) the second object is one of a second electronic chip and a second wafer; and
c) at least two electrical connections are established between the first object and the second object after the first object and the second object are in the desired position and orientation.

13. The method for positioning and orienting a first object relative to a second object as in claim 1, wherein:
a) the first object and the second object are electronic chips.

14. The method for positioning and orienting a first object relative to a second object as in claim 1, wherein:
a) the first object and the second object are electronic wafers.

15. The method for positioning and orienting a first object relative to a second object as in claim 1, wherein:
a) the first object is a chip and the second object is an electronic wafer.

16. The method for positioning and orienting a first object relative to a second object as in claim 1, wherein:
a) the first object includes at least one chip and the second object includes at least one electronic wafer; and
b) the near field transducer is on a different location on each of the at least one electronic chip, and the sensor is on a different location on each of the at least one electronic wafer and the at least one electronic chip.

17. The method for positioning and orienting a first object relative to a second object as in claim 1, wherein:
a) a post is provided on at least one of the first object and the second object, the post controls a minimum separation between the first object and the second object.

18. The method for positioning and orienting a first object relative to a second object as in claim 1, wherein:
a) the first and the second objects are positioned inside a dust free chamber;
b) the first object is a first magnetic read head, and the second object is a disk containing information stored in the form of magnetic bits; and c) a second magnetic read head is provided, and the disk is removed from the second magnetic read head and positioned in a desired position relative to the first magnetic read head.

19. The method for positioning and orienting a first object relative to a second object as in claim 18, wherein:
   a) the information on the disk is stored in the form of bits with different magnetic permeability;
   b) each of the first and second magnetic read heads includes a source for a magnetic probe field;
   c) the magnetic probe field can be altered by the magnetic permeability of the bits; and
   d) each of the first and second magnetic read heads measures the degree to which the magnetic field is altered by magnetic permeability of the bits.

20. A method for positioning and orienting a first object relative to a second object, the method comprising:
   a) positioning a near field transducer having an aperture on the first object;
   b) directing a laser light toward the aperture of the near field transducer on the first object to create an evanescent wave on the other side of the aperture;
   c) positioning a sensor on the second object for detecting the evanescent wave from the near field transducer; and
   d) providing an algorithm, using a signal amplitude and using the known position and orientation of the near field transducer and the sensor on the first and second objects in the algorithm to determine a desired position and orientation, and using the algorithm to control a nanopositioning system to position the first object in the desired orientation and location relative to the second object.

* * * * *